United States Patent [19]

Pike

[11] Patent Number: 4,500,798

[45] Date of Patent: Feb. 19, 1985

[54] DIODE SIMULATOR CIRCUIT

[75] Inventor: Winthrop S. Pike, Princeton, N.J.

[73] Assignee: RCA Corporation, New York, N.Y.

[21] Appl. No.: 424,138

[22] Filed: Sep. 27, 1982

[51] Int. Cl.[3] .................... H03K 3/26; G06G 7/12
[52] U.S. Cl. ............................ 307/317 R; 307/490;
307/362; 328/142
[58] Field of Search .................. 307/317 R, 490, 362,
307/363; 333/213; 328/142

[56] References Cited

U.S. PATENT DOCUMENTS

| 3,350,512 | 10/1967 | Percival et al. | 179/100.2 |
| 3,541,350 | 11/1970 | Luetze | 328/142 |
| 4,251,742 | 2/1981 | Beelitz | 307/317 R |

Primary Examiner—John S. Heyman
Assistant Examiner—B. P. Davis
Attorney, Agent, or Firm—E. M. Whitacre; P. J. Rasmussen; R. G. Coalter

[57] ABSTRACT

A pair of voltage followers, having offsets which differ by a fraction of the threshold voltage of a diode, are coupled to respective sources of signal and load voltage to provide unequally offset ouput voltages. An amplifier, coupled to the voltage followers, provides an output current when the difference of the signal and load voltages is of a given sense and magnitude, the output current being substantially zero otherwise. The amplifier includes a transconductance control element for regulating the differential voltage-to-current conversion gain thereof and a current mirror for applying the output current to the load in a sense to reduce difference between the signal and load voltages thereby simulating a diode having independently controllable threshold voltage and forward conductance characteristics, having negligible reverse conduction, which provides a power gain with high stability and substantially no tendency toward oscillations and which may be constructed in integrated circuit form without need for special processing steps. In an exemplary application, the simulator includes plural amplifiers for controlling dead zones of an adaptive control signal filter of an audio signal expander.

20 Claims, 8 Drawing Figures

DIODE SIMULATOR CIRCUIT

FIELD OF THE INVENTION

This invention relates to electrical circuits and particularly to circuits for simulating certain characteristics of semiconductor diodes.

BACKGROUND OF THE INVENTION

Semiconductor diodes exhibit a forward conduction threshold voltage effect that is characteristic, among other things, of the material of which the diode is made. The threshold voltage of a given diode is generally considered to correspond to the so-called "knee" of the diode forward conduction characteristic curve and is typically about 700 millivolts at room temperature for a small signal silicon diode or silicon transistor junction. The threshold voltage of germanium diodes or of Shottky barrier silicon diodes is, typically, about half that of a conventional PN junction silicon diode.

In certain applications the threshold voltage of a semiconductor diode is used to establish a reference level for processing of electrical signals. As an example, in the audio noise reduction system proposed by Christopher et al. in U.S. patent application Ser. No. 229,743 filed Jan. 29, 1981, an adaptive filter for an audio signal expander is disclosed wherein a semiconductor diode is used as a threshold switch for modifying the filter time constant under certain dynamic signal conditions. As another example, type IN914 silicon diodes are employed as threshold devices in the adaptive filter of an audio expander circuit described by J. Roberts in the article "$70 Decoder for New CX Records" published in the January, 1982, issue of POPULAR ELECTRONICS magazine, pp. 39-44.

In the interest of cost reduction and improved reliability, it would be desirable to implement syllabic audio expanders, such as those described above, in integrated circuit form. It is further desirable to operate the integrated circuit at a relatively low supply voltage level so as to obtain benefits such as reduced power consumption, reduced heat build-up, and improved reliability. Generally speaking, circuits which are designed to operate at a given supply voltage when using conventional silicon transistors or diodes as threshold conduction devices may be "scaled down", so to speak, to operate at a lesser supply voltage by substituting diodes having a proportionally lower threshold voltage (e.g., germanium diodes, Shottky barrier silicon diodes, etc.) for the silicon diodes. Such a substitution, however, presents certain practical difficulties with regard to integrated circuit fabrication.

As an example, direct substitution of diodes of different materials or construction on the integrated circuit "chip" may require a further processing step (e.g., an added metalization or a deposition of a further semiconductor material). This may reduce the process yield. An alternative of connecting the "substitute" diode to the integrated circuit via external pin connections avoids the need for extra processing steps but requires additional circuit pins which may not be available in the desired integrated circuit package. Also, additional assembly costs may be involved in connecting the substitute diode to the extra pins and reliability may be degraded by the added connections. A further difficulty is that the "substitute" diode may have forward or reverse bias conduction characteristics which are greatly different from the desired "scaled down" values.

SUMMARY OF THE INVENTION

In view of the foregoing, it is an object of the invention to provide an electrical circuit for simulating a semiconductor diode and having selected parameters, including threshold voltage and forward conduction, which are independently and non-interactively controllable.

It is a further object of the invention to provide a diode simulation circuit exhibiting relatively low or negligible reverse conduction and which features high stability with essentially no tendency toward oscillation.

It is yet another object of the invention to provide a diode simulation circuit having an impedance transformation characteristic that provides a power gain and which, if desired, may be constructed in integrated circuit form without requiring special processing steps.

A diode simulation circuit embodying the invention includes an input terminal for receiving a signal voltage and an output terminal for both supplying an output current to a load and for receiving a load voltage developed by said load. A first voltage follower is coupled to track the signal voltage and a second voltage follower is coupled to track the load voltage, each voltage follower having an offset voltage. The offset voltage of one voltage follower is controllable and differs from that of the other by a fraction, less than unity, of the threshold voltage of a forward biased semiconductor diode means in the one voltage follower. An amplifier means, responsive to the unequally offset output voltages produced by the voltage followers produces the output current when the difference of the signal and load voltages is of a given polarity and exceeds a threshold level, the output current of the amplifier means being substantially zero otherwise. The amplifier means includes a transconductance control means for regulating the differential voltage-to-current conversion gain of the amplifier means at a predetermined value and an output means for supplying the output current ot the output terminal in a sense to reduce the difference between the signal and load voltages.

BRIEF DESCRIPTION OF THE DRAWINGS

The invention is illustrated in the accompanying drawings wherein like elements are identified by like designators and in which.

DETAILED DESCRIPTION

Figure 1:
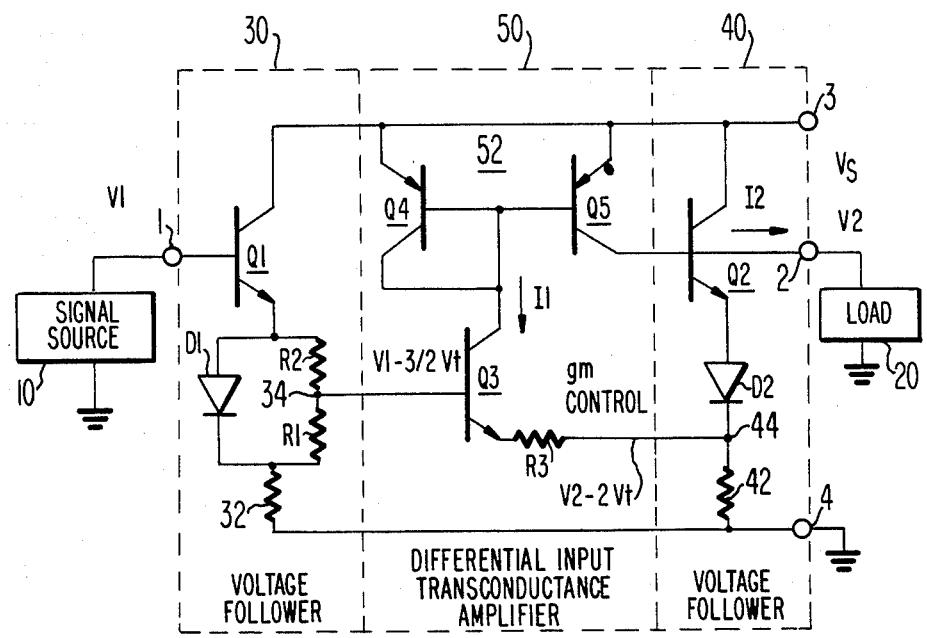
FIG. 1 is a circuit diagram, partially in block form, of a diode simulator circuit embodying the invention.

The diode simulator circuit of FIG. 1 is intended for use with a signal source 10 and a load 20 for supplying an output current I2 to the load when the source voltage V1 and load voltage V2 differ in a given sense (V1 more positive) by more than a fraction, less than unity (e.g., ½), of the threshold voltage Vt of a semiconductor diode D1 in the simulator. As will be explained, the circuit also simulates a predetermined forward conduction series resistance which is both controllable and independent of the actual forward conduction resistance of diode D1.

The circuit includes an input terminal 1 for receiving the input signal voltage V1 from source 10 and an output terminal 2 having dual functions of supplying the output current I2 to load 20 and providing a point for sensing or monitoring the load voltage V2 developed by load 20. For purposes of the present invention, the load may comprise any suitable utilization device and it may also receive current from sources other than the diode simulator circuit. The load may comprise, for example, an active device or a passive network or element. Also, the equivalent load impedance may be purely resistive, purely reactive or complex without causing instability in the simulator circuit.

Input terminal 1 is coupled to the base electrode on an NPN bipolar transistor Q1 of a first voltage follower 30 (outlined in phantom). Transistor Q1 has a collector electrode coupled to a first supply terminal 3 for receiving a positive supply voltage, Vs, an emitter electrode coupled to a second supply terminal 4 (ground) via a series circuit including, in the order named, diode D1 and a resistor 32. Diode D1 is poled in a sense to be forward biased and will be assumed to be a silicon diode having a threshold voltage Vt. Voltage follower 30 also includes an output node 34 coupled to the anode and cathode electrodes of diode D1 via resistors R1 and R2, respectively.

Resistors R1 and R2 function as a potential divider which, being connected in parallel with diode D1, has the effect of reducing or attenuating the overall offset voltage of the voltage follower circuit 30 by a fraction of the threshold voltage Vt of diode D1. As an illustration of the net offset voltage reduction, assume that transistor Q1 is a silicon device having a base-emitter junction threshold voltage equal to Vt and that resistors R1 and R2 are of equal values. Under these assumptions, transistor Q1 will offset the signal voltage V1 by Vt and diode D1 will offset the signal voltage by an additional Vt giving a total offset of 2 Vt at the cathode of diode D1. The potential divider R1–R2 reduces the component of the diode D1 offset by a factor of one-half so that the net offset between terminal 1 and node 34 equals 1.5 Vt. The output voltage of follower 30 at node 34 is, therefore, equal to $V1-(3/2)Vt$.

The net offset voltage reduction may be controlled by appropriately scaling the values of resistors R1 and R2. As an example, if R2 has a value 9 times that of R1, then the offst reduction will equal 0.1 Vt which corresponds to that portion of the offset voltage appearing across resistor R1. The offset reduction may be calculated by dividing the value of resistor R1 and R2 and multiplying the result by the threshold voltage Vt of diode D1. It will be noted that the offset voltage developed by transistor Q1 does not enter into the calculation of the offset voltage reduction.

A second voltage follower 40 (outlined in phantom) includes a further NPN bipolar transistor Q2 connected at the base and collector electrode thereof to output terminal 2 and supply terminal 3, respectively. The emitter electrode of transistor Q2 is coupled via a diode D2 to an output node 44 which, in turn, is coupled to terminal 4 via a resistor 42. Transistor Q2 has a threshold voltage selected to match that of transistor Q1 and diode D2 has a threshold voltage selected to match that of diode D1. It will be assumed also that all semiconductor devices of this example of the invention are of the same material (e.g., silicon) and that they have equal threshold voltage of Vt. Accordingly, the load voltage V2 at terminal 20 will be offset in voltage follower 40 by V2–2 Vt. This differs from that of follower 30 by 0.5 Vt, the offset voltage difference being determined by resistors R1 and R2.

The remaining portion of the diode simulator comprises a differential input transconductance amplifier 50 which provides plural functions including: sensing the unequally offset output voltages of followers 30 and 40 to produce an output current I1 when the sensed voltages differ in a given sense by a given amount; scaling the output current by a factor K; applying the scaled output current I2 to the output terminal in a sense to reduce the source/load voltage difference; and controlling the output impedance of the simulator circuit.

In detail, amplifier 50 comprises an NPN transistor Q3 having a base electrode coupled to output node 34 of voltage follower 30, an emitter electrode coupled via a resistor R3 to output node 44 of voltage follower 40 and a collector electrode coupled to output terminal 2 via a current mirror amplifier 52 comprising PNP transistors Q4 and Q5 having emitter electrodes connected to supply terminal 3 and base electrodes connected in common with the collector electrodes of transistors Q3 and Q4. The collector electrode of transistor Q5 is coupled to output terminal 2 and to the base electrode of transistor Q2. All transistors will be assumed to be silicon devices having threshold voltages equal to Vt.

In operation, transistor Q3 compares the offset voltages at nodes 34 and 44 and provides an output current I1 to current mirror amplifier 52 when the node 34 voltage exceeds that at node 44 by Vt. Since the offset provided by follower 30 is 0.5 Vt less than that of follower 40, current I1 will begin to flow when the signal voltage V1 is 0.5 Vt more positive than the load voltage V2.

Emitter resistor R3 controls the effective transconductance, gm, of transistor Q3 whereby the magnitude of I1 is directly proportional to the difference of the node 34 and 44 voltages less Vt of transistor Q3 and inversely proportional to the value of resistor R3. Selecting a relatively high value for R3 decreases the transconductance and increases the effective output resistance of the simulator circuit. Conversely, decreasing the value of resistor R3 results in an increase in transconductance with a corresponding decrease in the simulator circuit output resistance. When the current I1 is zero, no current is supplied to output terminal 2 and the equivalent output impedance is essentially infinite (i.e., the output terminal is essentially an open circuit). This neglects, of course, the relatively small loading effect at terminal 2 of follower 30. As a practical matter, the input impedance of transistor Q2 is so high as to represent negligible loading and so the effective "leakage" resistance of the diode simulator to ground is also negligible.

Current mirror amplifier 52, in addition to reversing the direction of output current flow, provides scaling of the output current I2 by a factor equal to its current gain K. For identical mirror transistors, K is unity so that I1 will equal I2. The mirror gain factor K, however, may be other than unity and provides a further means for transconductance control.

As previously mentioned, the diode simulator circuit exhibits a power gain and is unconditionally stable, that is, it has essentially no tendency toward oscillation. The power gain results because of the impedance transformation between the circuit input and output terminals. The output impedance (when output current is flowing) is relatively low as determined by resistor R3 and the mirror current gain factor K whereas the input impedance is always high since transistor Q1 is operated in a voltage follower mode requiring only a small bias current. Stability is obtained by using voltage followers for sensing and offsetting the input and load voltages. The voltage followers introduce no significant phase shift and have voltage gains not greater than unity. The circuit load also enhances the simulator stability, particularly where the load includes a capacitor. With such a load, a frequency breakpoint is produced in the simulator circuit transfer characteristic. The frequency where the breakpoint occurs may be controlled by selection of the value of resistor R3, the mirror current gain factor K and the value of the load capacitor with due consideration being given, of course, to any other impedances which might be associated with the load in a given application.

Figure 2:
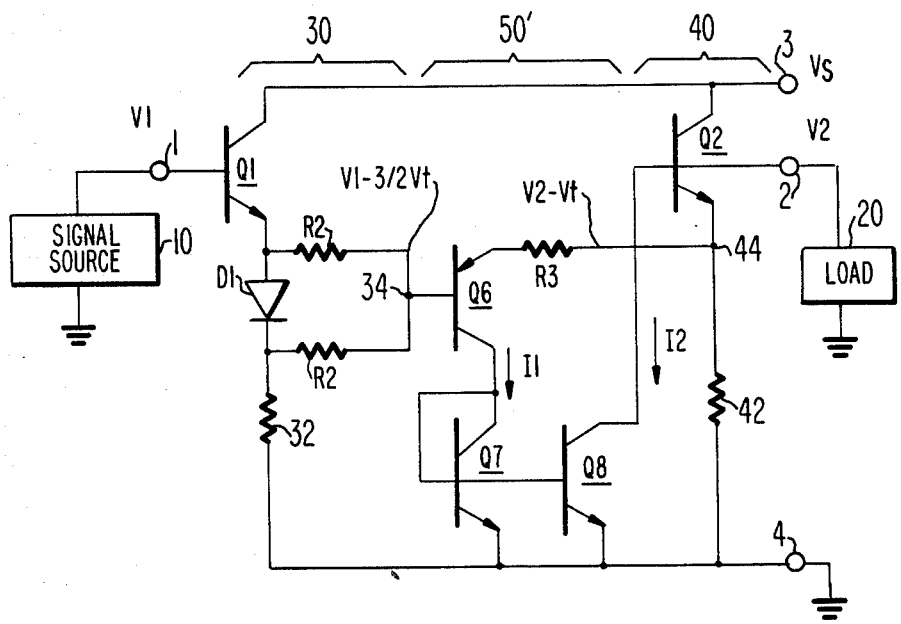
FIGS. 2, 3, 4 and 5 illustrate modifications of the simulator circuit of FIG. 1.

The simulator circuit of FIG. 1 may be modified as shown in FIG. 2 to supply the output current I2 in the opposite sense to the output (load) terminal 2. The modification comprises removing diode D2 from the emitter load circuit of transistor Q2 and replacing NPN transistor Q3 and PNP transistors Q7 and Q8, respectively. The connections of transistor Q6 correspond to those of former transistor Q3. The connections of transistors Q7 and Q8 correspond essentially to those of former transistors Q4 and Q5 except that the emitter electrodes are coupled to terminal 4 rather than to terminal 3.

Operation of the simulator circuit of FIG. 2 is substantially the same as that of FIG. 1 except that the NPN current mirror amplifier Q7–Q8 withdraws current from load terminal 2 when V1 is less positive than V2–0.5 Vt. As in the previous example of the invention, the node 34 voltage equals V1 less an offset of 1.5 Vt. The node 44 voltage, in this case, is higher since diode D2 is omitted and equals V2 less Vt. Since the offsets differ by 0.5 Vt, transistor Q6 (assumed to have a threshold of Vt) will be biased on when V1 is 0.5 Vt less than V2. As in the previous example, resistors R1 and R2 determine the fractional offset voltage difference. Resistor R3 and the mirror gain factor K determine the transconductance of amplifier 50' and thus control the effective output resistance of the simulator circuit when load current is flowing.

Figure 3:
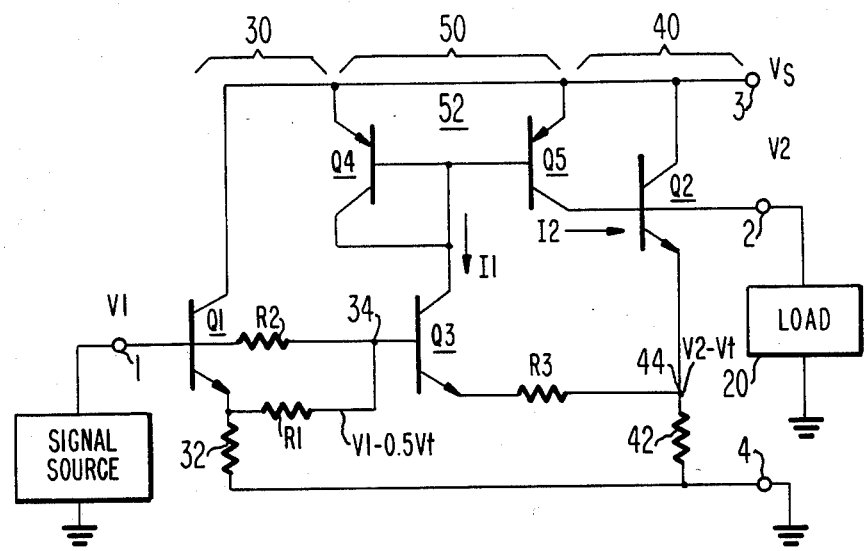

FIG. 3 illustrates a modification of the simulator circuit of FIG. 1 for eliminating diodes D1 and D2. In the modified simulator, node 44 is connected directly to the emitter electrode of transistor Q2 and the divider circuit comprising resistors R2 and R1 is connected in parallel with the base-emitter junction of transistor Q1.

In operation, the threshold voltage of the modified simulator circuit is the same as before (0.5 Vt) since the offsets of both voltage followers have been changed (reduced) by equal amounts (Vt). The offset (at node 34) of follower 30 is now 0.5 Vt and that at node 44 is 1.0 Vt. One effect of the modification is that the simulator input impedance is reduced by the loading effect at input terminal 1 caused by the offset voltage divider R1–R2. This will tend to reduce the effective power gain of the simulator circuit. To minimize loading of signal source 10 it is desirable to select offset voltage divider resistor values such that the sum thereof is high relative to the output impedance of the signal source.

Figure 4:
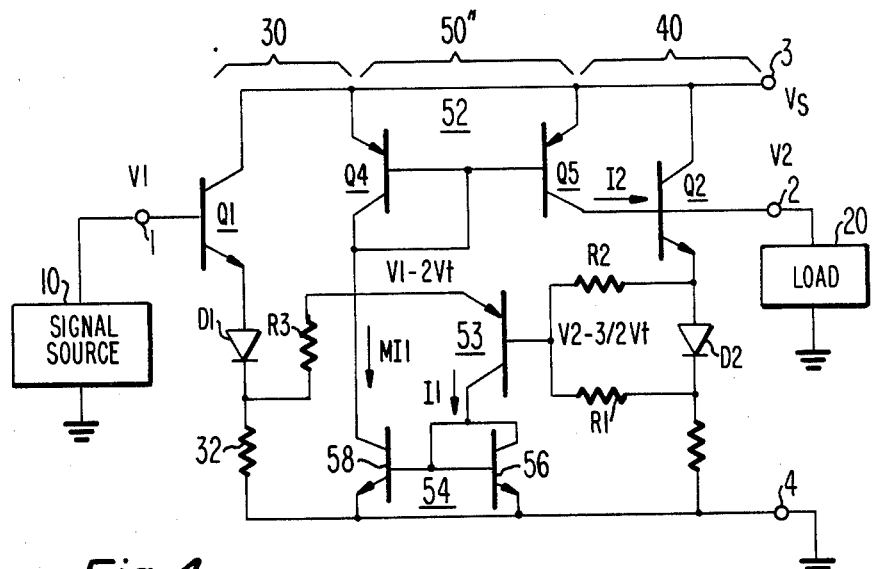

In the examples of the invention discussed thus far, the difference (0.5 Vt) between the offsets of followers 30 and 40 was obtained by means of an offset attenuator or divider in follower 30. FIG. 4 illustrates an alternative embodiment of the invention where the offset reducing element (resistors R1 and R2) is placed in the output or load voltage follower 40 rather than in the input or signal source voltage follower 30.

In FIG. 4, NPN transistor Q3 has been replaced by a PNP transistor 53 having a base electrode coupled to the anode and cathode terminals of diode D2 via resistors R2 and R1, respectively, an emitter electrode coupled to the cathode of diode D1 via resistor R3 and a collector electrode coupled to the input of current mirror amplifier 52 via a further current mirror amplifier 54. Amplifier 54 is complementary to amplifier 52 and comprises a diode connected NPN transistor 56 coupled between the collector electrode of transistor 53 and terminal 4 and connected in parallel with the base-emitter junction of an NPN transistor 58. The collector of transistor 58 is connected to the input transistor Q4 of mirror 52.

Operation of the modified circuit is substantially the same as in the example of FIG. 1 except that the fractional differential offset (0.5 Vt) is provided by follower 40 rather than follower 30. Specifically, the offset control resistors R1 and R2 bias the base of transistor 53 at a potential V2−1.5 Vt and the transconductance control resistor R3 biases the emitter of transistor 53 at a potential V1−2 Vth. Thus, the offset difference equals half the threshold of transistor 53 which therefore turns on when the signal voltage V1 exceeds the load voltage V2 by 0.5 Vt.

Current mirror amplifier 54 reverses the direction of the current I1 produced by transistor 53 so as to be in a proper sense for application to amplifier 52. The output current of mirror 54 is M times I1 where M is the current gain of mirror 54 whereby the net output current of the simulator circuit (I2) equals the product of K, M and I1.

Figure 5:
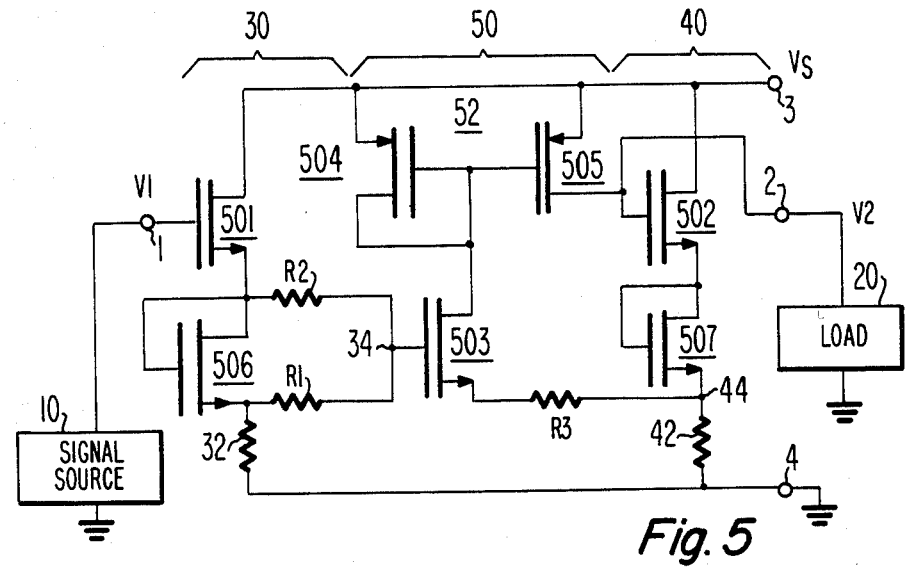

The examples of the invention discussed thus far employ bipolar transistors and PN semiconductor diodes. The principles of the invention, however, are of general utility and may be readily applied to other types of transistors and diodes. FIG. 5, for example, does not employ any bipolar transistors or PN junction semiconductor diodes.

In FIG. 5 each transistor and diode of the simulator circuit of FIG. 1 has been replaced by corresponding enhancement mode field effect transistor. NPN transistors Q1, Q2 and Q3 have been replaced by respective N-channel field effect transistors 501, 502 and 503. PNP transistors Q4 and Q5 have been replaced by respective P-channel field effect transistors 504 and 505. Diodes D1 and D2 have been replaced by diode-connected N-channel field effect transistors 506 and 507, respectively.

Operation of the simulator is substantially the same as in the example of FIG. 1 with the exception that the input impedance is substantially increased. The simulator threshold voltage, of course, will be different assuming the same values for resistors R1 and R2 since the threshold voltage of field-effect transistors is, typically, greater than that of bipolar transistors. One may vary the R1–R2 resistance ratio, if desired, to simulate lower or higher threshold voltages. The transconductance of the modified circuit will be somewhat reduced because of the generally lower gm characteristic of field effect transistors as compared with that of bipolar transistors. The mirror 52 gain, however, may be adjusted to compensate for the lower transconductance if desired or, alternatively, the value of resistor R3 may be changed (a lower value increases the effective gm and reduces the simulator circuit equivalent series output resistance).

Figure 6:
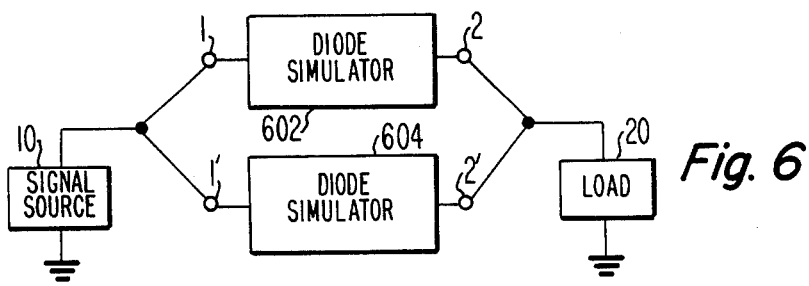
FIG. 6 is a block diagram illustrating parallel operation of plural diode simulators.

In the foregoing examples of the invention, each circuit simulates the characteristics of a single diode and series resistor, the diode being effectively isolated from the circuit input terminal. Plural diodes having individually controllable threshold voltages and series resistances may be simulated by connecting the simulator circuits in parallel as shown in FIG. 6. There, the input terminals 1 and 1' of simulators 602 and 604, respectively, are connected to source 10 and the simulator output terminals 2 and 2' are connected to load 20.

The high stability of the individual simulators (as previously discussed) minimizes any tendency for oscillations to occur in the parallel combination. Simulators 602 and 604 may each comprise any desired one of the circuits of FIGS. 1–5 to thereby simulate directly paralleled diodes, or inversely paralleled diodes and more complex combinations of diodes may be simulated by adding more simulator circuits to the parallel combination.

Figure 7:
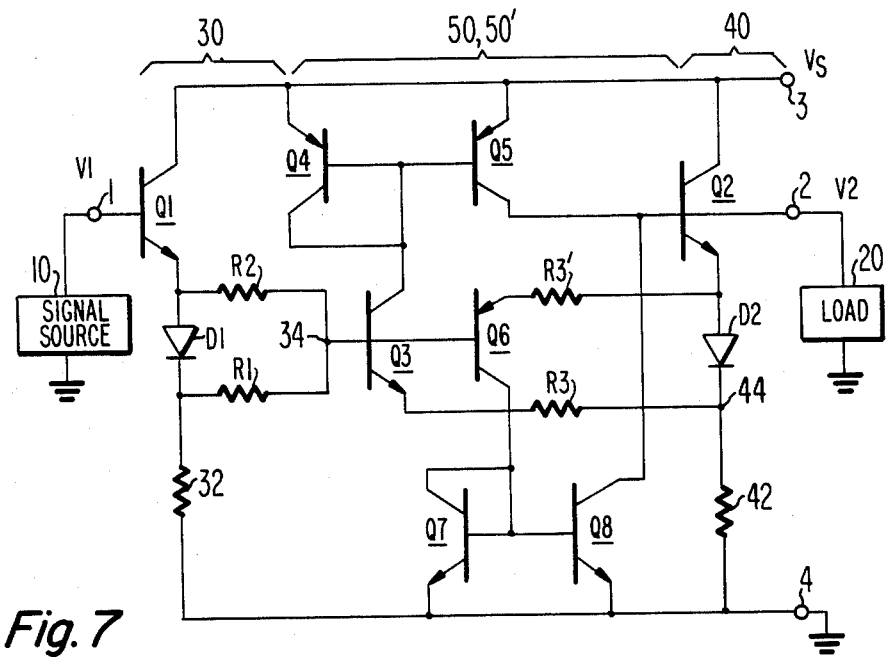
FIG. 7 is a circuit diagram of a double diode simulator embodying the invention.

FIG. 7 illustrates a preferred method of simulating plural diodes and which provides the equivalent function and performance of the parallel coupled simulators shown in the example of FIG. 6 yet requires far fewer circuit elements and consumes substantially less operating power. A further advantage is that the input impedance is at least double that obtainable by means of paralleling simulators and the equivalent "leakage" of the simulated diodes is lower than that obtainable in the parallel simulator configuration. Other advantages (e.g., improved reliability, cost reduction, etc.) are self evident.

The specific function provided by the simulator of FIG. 7 is to simulate inverse parallel connected diodes, each having a low threshold voltage and a separately controllable series resistance for supplying current to load 20 in proportion to another resistance value when V2 exceeds V1 by 0.5 Vt. This function is achieved by "merging" the simulator circuits of FIGS. 1 and 2. The result, as shown, is the same as FIG. 1 except for the addition of the amplifier portion 50' of FIG. 2. The emitter resistor of transistor Q6 taken from FIG. 2 is signified by a prime (R3') to distinguish it from the emitter resistor (R3) of transistor Q3 in the "merged" simulator circuit.

In operation, the source follower circuits 30 and 40 are effectively shared by amplifiers 50 (i.e., Q3–Q5 and R3) and 50' (i.e., Q6–Q8 and R3'). Otherwise the operation is the same as that described individually for the simulator circuits of FIGS. 1 and 2. Briefly, since the sign of the differential voltage-to-current conversion gain of amplifier 50' is opposite to that of amplifier 50, the two amplifiers supply output currents of opposite sense to terminal 2. For example, transistor Q5 supplies current to terminal 2 when V1 exceeds V2 by 0.5 Vt and transistor Q6 supplies current in the opposite sense to terminal 2 when V2 exceeds V1 by 0.5 Vt. If desired, transistors Q3 and Q6 may be coupled to diode D1 via respective attenuators (not shown) to individually control the simulator forward and reverse threshold voltages. Also, resistor R3 may have a different value than resistor R3' to simulate different "source" and "sink" output impedances. When the voltages V1 and V2 do not differ by the selected threshold values, the output impedance is essentially infinite (again, neglecting the load effect of transistor Q2).

Figure 8:
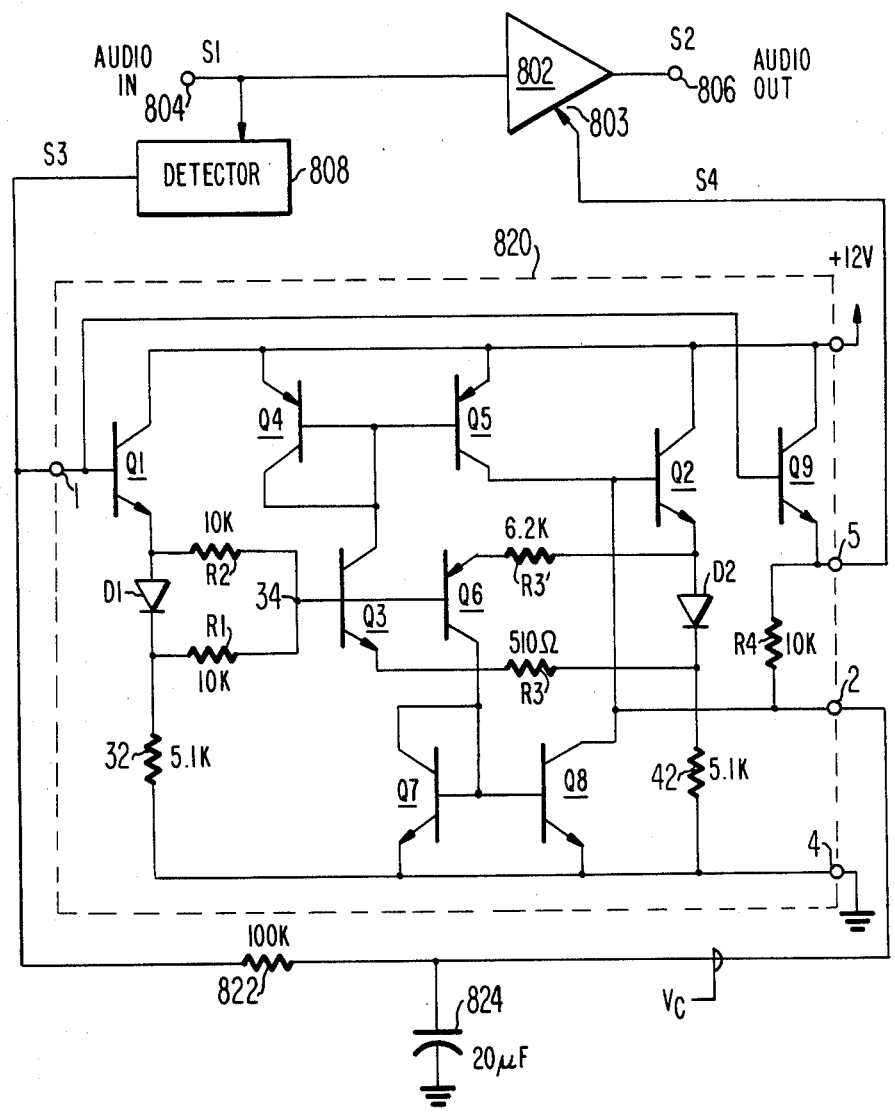
FIG. 8 is a circuit diagram, partially in block form, of a syllabic expander including a plural diode simulator circuit embodying the invention.

FIG. 8 illustrates a specific application of the principles of the invention wherein the diode simulator circuit of FIG. 7 is modified to control the threshold levels and time constants of an adaptive control signal filter in a syllabic audio signal expander. The system comprises a controllable gain amplifier 802 having an input coupled to an audio input terminal 804 for receiving an audio signal S1 to be expanded, an output coupled to an output terminal 806 for providing an expanded audio output signal S2 and having a gain control terminal 803. The input of a detector 808 is coupled to terminal 804 to provide a control signal S3 at the detector output representative of the envelope of input signal S1. Detector 808 may be of any suitable form (e.g., peak, average or RMS responding) and amplifier 802 may comprise, for example, an operational transconductance amplifier or some other suitable form of variable gain or variable transmission device.

If the control signal S3 were applied directly to gain control terminal 803, the resultant system would provide expansion of signal S1 but the output signal S2 would contain undesirable audiable modulation products caused by changes in the envelope of signal S1. To avoid such an undesirable effect (known as "pumping" or "breathing") the control signal S3 is first applied to an adaptive filter having time constants which change or adapt to the dynamic changes in the envelope of the signal to be expanded. The resultant filtered control signal S4 is applied to terminal 803 of amplifier 802.

The adaptive filter comprises a diode simulator circuit 820, a resistor 822 and a single capacitor 824. Circuit 820 corresponds to that of FIG. 7 modified to include a further output terminal 5, a further NPN transistor Q9 (connected at the base, collector and emitter electrodes thereof, respectively, to terminals 1, 3 and 5) and a further resistor R4 connected between terminals 2 and 5. Terminal 2 is coupled to ground via capacitor 824 and to terminal 1 via resistor 822. Terminals 1 and 5 are coupled, respectively, to the output of detector 808 and to the control terminal 803 of amplifier 802. Exemplary element values are shown in the drawing.

In the following examples of operation it will be assumed that the diodes and transistors of circuit 820 are silicon devices having substantially equal threshold voltages (Vt), that the current mirror amplifiers (Q4, Q5 and Q7, Q8) have current gains of unity, that a positive supply voltage is applied to terminal 3 and that the input impedance at terminal 803 of amplifier 802 is substantially greater than the value of resistor R4. In applications where the control terminal input impedance of the variable gain amplifier is not high, one may couple terminal 5 to the amplifier via a suitable buffer amplifier (not shown) to minimize control signal loading effects on the filter operation.

It will initially be assumed that the audio signal S1 is of a constant level and has been constant for a period of time sufficient for the load capacitor 824 to charge to the level of S3. In this condition the voltages at terminals 1 and 2 will be equal and so transistors Q3–Q8 will all be off for the reasons previously discussed. Since the input impedance of the control terminal 803 is high relative to the value of resistor R4, the voltage at terminal 5 will be essentially equal to Vc thereby biasing transistor Q9 off and causing amplifier 802 to exhibit a constant gain.

Now assume that S1 decreases in level at a rate that is slow as compared with the time constant (about 2 seconds) of resistor 822 and capacitor 824. If the rate of decrease is such that S3 is never less positive than Vc−0.5 Vt, then transistors Q3–Q9 will remain off and the only effect will be a corresponding reduction in the gain of amplifier 802. However, if the level reduction is such that S3 becomes less than Vc−0.5 Vt, then transistors Q6–Q8 will turn on as previously described thereby providing a path to ground (via Q8) for discharging capacitor 824 more rapidly. The capacitor discharge time constant for this case is mainly determined by its value and the value of resistor R3'. For the circuit values shown, the rapid discharge time constant has been measured to be about 200 milliseconds. This results in a relatively rapid gain reduction which enables the audio output signal level to accurately follow relatively rapid decreases in the level of the audio input signal S1 as is characteristic, for example, of musical de-crescendos.

When the level of S1 increases at a relatively slow rate such that S3−Vc is less than 0.5 Vt, transistors Q3–Q9 will remain off and the gain of amplifier 802 will slowly increase. If, however, the rate of increase is such that S3−Vc is in the range between 0.5 Vt and 1.0 Vt, then transistors Q3–Q5 will be turned on but transistor Q9 will remain off. Transistor Q5 will then supply additional charging current to capacitor 824 to increase the rate of charging thereby more quickly increasing the gain of amplifier 802. This enables faithful expansion of moderately rapid increases in the S1 signal level characteristic of a musical crescendo. The charging time constant in this case is controlled mainly by the values of resistor R3 and capacitor 824 and is very small as compared with the product R822-C824. For the element values shown, the charging time constant has been measured to be about 30 milliseconds.

Now assume that signal S1 increases very abruptly by an amount such that S3 exceeds Vc by Vt (the threshold of transistor Q9) or more and that the increase is a brief transient lasting substantially less than 30 milliseconds. Transistor Q9 will turn on during the transient period thereby coupling terminal 1 to terminal 5 and causing an essentially instantaneous increase in the gain of amplifier 802 for the duration of the transient. During this period, resistors R3 and R4 limit current flow to capacitor 824 so that when the transient ends, the gain of amplifier 802 quickly returns to its initial value. Transistor Q9 turns provides a path for the control signal S3 to effectively bypass capacitor 824 during large brief transients enabling essentially instantaneous gain increases and reductions.

Compression of audio signals may be obtained by connecting the expander circuit of FIG. 8 in a negative feedback path of an operational amplifier to thereby obtain a compression characteristic that is complementary to the expansion characteristic. In the specific example of FIG. 8 resistors R1 and R2 have been chosen to provide an expansion "dead zones" equal to 0.5 Vt. The dead zone widths may readily be controlled by changing the ratio of resistors R1 and R2. The expander time constants may be controlled by either changing the gains of the current mirror amplifiers or changing the values of the transconductance control elements (resistors R3 and R3'). Transistors Q3 and Q6 may be controlled by means of separate potential dividers having different division factors if desired in a given application. Other changes and modifications will be apparent to one of skill in the art.

What is claimed is:

1. A diode simulator circuit, comprising:
   an input terminal for receiving a signal voltage;
   an output terminal for supplying an output current to a load and for receiving a load voltage developed by said load;
   first and second voltage follower means, the first being coupled to track said signal voltage, the second being coupled to track said load voltage, said follower means providing unequally offset output voltages, the offset of one differing from that of the other by a fraction, less than unity, of the threshold voltage of a forward biased diode means in said one of said voltage follower means; and
   amplifier means including first means for sensing said unequally offset output voltages and producing a first current when the sensed voltages differ in a given sense by a given amount, said first current being substantially zero otherwise, second means for scaling said first current by a factor K, K being a non-zero constant, to provide a second current proportional to said first current, third means for applying said second current to said output terminal in a sense to reduce the difference between said sensed voltages and fourth means for controlling the transconductance of said amplifier means.

2. A diode simulator circuit as recited in claim 1 further comprising a second one of said amplifier means connected in parallel with the first named amplifier means.

3. A diode simulator circuit as recited in claim 2 wherein said second one of said amplifier means exhibits a differential voltage-to-current conversion gain of opposite sign to that of said first named amplifier means.

4. A diode simulator circuit as recited in claim 2 wherein said first means of one of said amplifier means comprises a transistor and wherein the first means of the other of said amplifier means comprises another transistor of complementary type.

5. A diode simulator circuit as recited in claim 1 wherein:
   said first means comprises transistor means having a control electrode coupled to receive the output voltage of one of said follower means and having a conduction path coupled at a first end thereof via said third means to receive the output voltage of the other of said follower means;
   said second means comprises current mirror amplifier means having an input coupled to the other end of said conduction path of said transistor means; and wherein
   said fourth means comprises means coupling an output of said current mirror amplifier means to said output terminal.

6. A diode simulator circuit as recited in claim 1 wherein at least one of said voltage follower means includes potential divider means for controlling the inequality of said offset voltages.

7. A diode simulator circuit as recited in claim 1 wherein each of said voltage follower means includes a respective load circuit, the load circuit of at least one of said follower means including said forward biased semiconductor means and wherein said at least one of said follower means includes potential divider means connected in parallel with said semiconductor means and having an output tap for providing the output voltage of at least one of said follower means.

8. A diode simulator circuit as recited in claim 2 further comprising low pass filter means having an input coupled to said input terminal and an output coupled to said output terminal.

9. A diode simulator circuit as recited in claim 8 further comprising a node and means for combining said signal voltage and said load voltage to provide a resultant voltage at said node.

10. A diode simulator circuit, comprising:
an input terminal for receiving a signal voltage and an output terminal for supplying an output current to a load and for receiving a load voltage developed by said load;
first voltage follower means coupled to track said signal voltage and second voltage follower means coupled to track said load voltage, each voltage follower means including a respective semiconductor diode means for imparting substantially equal offsets to the output voltages produced by said voltage follower means;
potential divider means connected in parallel with the semiconductor diode means of a selected one of said voltage follower means; 'a transconductance control element;
transistor means having a control electrode coupled to an output tap of said potential divider means and a conduction path coupled at one end thereof to an output node of the other of said voltage follower means via said control element; and
current mirror amplifier means for coupling the other end of the conduction path of said transistor means to said output terminal.

11. A diode simulator circuit as recited in claim 10, further comprising:
a second transconductance control element;
a second transistor means having a control electrode coupled to said output tap of said potential divider means and a conduction path coupled at one end thereof to said output node of said other of said voltage followers via said second control element; and
a second current mirror amplifier means for coupling the other end of the conduction path of said transistor means to said output terminal.

12. A diode simulator circuit as recited in claim 11 wherein one of said transistor means is of a given conductivity type and wherein the other of said transistor means is of an opposite conductivity type.

13. A diode simulator circuit as recited in claim 12 further comprising:
a second output terminal;
an impedance means coupled between the first named output terminal and said second output terminal; and
a threshold conduction device coupled between said input terminal and said second output terminal.

14. A diode simulator circuit as recited in claim 13 further comprising a capacitor means coupled between said first named output terminal and a point of reference potential, a resistor coupled between said input terminal and said first output terminal and utilization means coupled to said second output terminal.

15. A diode simulator circuit, comprising:
an input terminal, an output terminal and first and second supply terminals;
a first transistor having base, emitter and collector electrodes coupled, respectively, to said input terminal, to a first node and to said first supply terminal;
a second transistor having base, emitter and collector electrodes coupled, respectively, to said output terminal, to a second node and to said first supply terminal;
a first diode and a first current source means coupled in series, in the order named, between said first node and said second supply terminal;
a second diode and a second current source means coupled in series, in the order named, between said second node and said second supply terminal;
potential divider means connected in parallel with said first diode and having an output tap;
third and fourth transistors, each having a base electrode coupled to said output tap, each having an emitter electrode coupled via a respective resistor to a respective end of said second diode;
a first current mirror amplifier for coupling the collector electrode of said third transistor to said output terminal; and
a second current mirror amplifier for coupling the collector electrode of said fourth transistor to said output terminal.

16. A diode simulator circuit as recited in claim 15 further comprising a fifth transistor having a base electrode coupled to said input terminal, a collector electrode coupled to said first supply terminal and an emitter electrode coupled to said output terminal via a further resistor, said emitter electrode of said fifth transistor being also coupled to a further output terminal.

17. A diode simulator circuit as recited in claim 16 further comprising a capacitor coupled between said first named output terminal and one of said supply terminals and a resistor coupled between said input terminal and said first named output terminal.

18. A diode simulator circuit, comprising:
an input terminal for receiving a signal voltage and an output terminal for both supplying an output current to a load and for receiving a load voltage developed by said load;
first voltage follower means coupled to track said signal voltage and second voltage follower means coupled to track said load voltage, each voltage follower means having an offset voltage of one voltage follower means being controllable and differing from that of the other by a fraction, less than unity, of the threshold voltage of a forward biased semiconductor means in said one voltage follower means;
amplifier means, responsive to the unequally offset output voltages produced by said voltage follower means for producing said output current when the difference of the signal and load voltages is of a given polarity and exceeds a threshold level, said output current of said amplifier means being substantially zero otherwise;
transconductance control means in said amplifier means for regulating the differential voltage-to-current conversion gain thereof at a predetermined value; and
output means for coupling said output current of said amplifier means to said output terminal in a sense to reduce the difference between said signal and load voltages.

19. In combination:

first means for providing a signal voltage and a load voltage which may differ from said signal voltage;

second means for translating said voltages by unequal amounts;

third means responsive to the translated voltages to provide an output current when the difference between said signal and load voltages is of a given polarity and exceeds a given value, said value being equal to a fraction, less than unity, of the threshold voltage of a semiconductor device in said second means, said output current being substantially zero otherwise; and fourth means for applying said output current to said first means in a sense to reduce said difference.

20. The combination as recited in claim 19 wherein said second means includes potential divider means connected in parallel with said semiconductor device for controlling the magnitude of said given value, wherein said third means includes transconductance control means for controlling the magnitude of said output current and wherein said fourth means comprises a current mirror amplifier.

* * * * *